(«12») United States Patent  
Kim

(10) Patent No.: US 6,333,250 B1
(45) Date of Patent: Dec. 25, 2001

(54) METHOD OF FORMING GATE ELECTRODE IN SEMICONDUCTOR DEVICE

(75) Inventor: Hyeon Soo Kim, Taegu (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/460,557

(22) Filed: Dec. 14, 1999

(30) Foreign Application Priority Data

Dec. 28, 1998 (KR) .................................................. 98-59169

(51) Int. Cl.[7] .................................................. H01L 21/28
(52) U.S. Cl. .......................................... 438/595; 438/592
(58) Field of Search .................................. 438/585, 592, 438/595, 593, 594

(56) References Cited

U.S. PATENT DOCUMENTS

| | | | |
|---|---|---|---|
| 4,404,732 | 9/1983 | Andrade | 29/571 |
| 4,740,826 | 4/1988 | Chatterjee | 357/42 |
| 4,929,567 | 5/1990 | Park et al. | 437/41 |
| 5,071,788 | 12/1991 | Joshi | 437/192 |
| 5,112,765 | 5/1992 | Cederbaum et al. | 437/41 |
| 5,116,774 | 5/1992 | Huang et al. | 437/40 |
| 5,212,400 | 5/1993 | Joshi | 257/412 |
| 5,599,725 | 2/1997 | Dorleans et al. | 437/40 |
| 5,633,522 | 5/1997 | Dorleans et al. | 257/344 |
| 5,688,706 | 11/1997 | Tseng | 437/45 |
| 5,789,312 | 8/1998 | Buchanan et al. | 438/585 |
| 5,858,867 | 1/1999 | Hsia et al. | 438/592 |
| 5,925,918 | * 7/1999 | Wu et al. | 257/213 |
| 5,998,290 | * 12/1999 | Wu et al. | 438/595 |
| 6,037,228 | * 3/2000 | Hsu | 438/593 |
| 6,075,274 | * 6/2000 | Wu et al. | 257/413 |
| 6,107,171 | * 8/2000 | Tsai | 438/595 |
| 6,165,883 | * 12/2000 | Hiura | 438/592 |
| 6,235,621 | * 5/2001 | Jung et al. | 438/592 |
| 6,236,093 | * 5/2001 | Hiura | 257/413 |

FOREIGN PATENT DOCUMENTS

| | | | |
|---|---|---|---|
| 55030867 | 3/1980 | (JP) | H01L/29/78 |
| 60015920 | 1/1985 | (JP) | H01L/21/30 |
| 61241974 | 10/1986 | (JP) | H01L/29/78 |
| 01125985 | 5/1989 | (JP) | H01L/29/80 |
| 01175257 | 7/1989 | (JP) | H01L/29/78 |
| 01187871 | 7/1989 | (JP) | H01L/29/78 |
| 01207971 | 8/1989 | (JP) | H01L/29/78 |
| 01207972 | 8/1989 | (JP) | H01L/29/78 |
| 01207973 | 8/1989 | (JP) | H01L/29/78 |
| 01251758 | 10/1989 | (JP) | H01L/29/78 |
| 02007552 | 1/1990 | (JP) | H01L/27/04 |
| 02026074 | 1/1990 | (JP) | H01L/29/784 |
| 02077162 | 3/1990 | (JP) | H01L/29/784 |
| 02129917 | 5/1990 | (JP) | H01L/21/302 |
| 04336468 | 11/1992 | (JP) | H01L/29/784 |
| 07263680 | 10/1995 | (JP) | H01L/29/78 |
| 10135452 | 5/1998 | (JP) | H01L/29/78 |

* cited by examiner

Primary Examiner—Mary Wilczewski
(74) Attorney, Agent, or Firm—Finnegan, Henderson, Farabow, Garrett & Dunner, L.L.P.

(57) ABSTRACT

A method of forming a gate electrode in a semiconductor device is disclosed. A method of forming a gate electrode in a semiconductor device according to the present invention includes steps of: forming a gate oxide layer, a polysilicon layer, a diffusion barrier layer, a metal layer and a mask layer on a semiconductor substrate, in sequence; patterning the mask layer, the metal layer and the diffusion barrier layer to the first width; patterning the mask layer, the metal layer and the diffusion barrier layer having the first width to a second width by wet etching; forming a spacer on the side walls of the mask layer, the metal layer and the diffusion barrier layer having the second width; and patterning the polysilicon layer and the gate oxide layer using the mask layer and the spacer as an etch barrier.

16 Claims, 3 Drawing Sheets

METHOD OF FORMING GATE ELECTRODE IN SEMICONDUCTOR DEVICE

BACKGROUND OF THE INVENTION

1. Field of the Invention

The present invention relates to a method of manufacturing a semiconductor device, and more particularly to a method of forming a tungsten gate electrode.

2. Description of the Related Art

In general, a polysilicon layer is used for a gate electrode material of a MOSFET. However, as high integration of a semiconductor device, the line width of the gate electrode is significantly reduced. Therefore, in case of a polysilicon gate electrode, it is difficult to obtain low resistivity required for the high integration device. Accordingly, a tungsten layer has been researched as the gate electrode material, recently.

In case of a tungsten gate electrode, gate re-oxidation process is generally performed after forming a tungsten gate electrode, for improving the reliability of a gate insulating layer. However, when performing the gate re-oxidation process, the side wall of a tungsten layer 5 is excessively oxidized due to its fast oxidation rate, to occur abnormal oxidation of the tungsten layer 5, as shown in FIG. 1, thereby deteriorating properties and reliability of a device. In FIG. 1, reference numbers 1, 2, 3 and 4 indicate a semiconductor substrate, a gate oxide layer, a polysilicon layer and a diffusion barrier layer, respectively. Furthermore, reference numbers 6 and 7 indicate a mask pattern used for etch barrier and a thermal oxidation layer grown by abnormal oxidation, respectively.

To solve the above problem, a method of forming a tungsten gate electrode using a spacer, is suggested. Referring to FIG. 2 when performing etch process to form a gate electrode, the tungsten layer 5 and the diffusion barrier layer 4 are etched and a spacer 8 is then formed on the side wall of the etched tungsten layer 5 and diffusion barrier layer 4. Therefore, when performing subsequent gate re-oxidation process, abnormal oxidation is not occurred on side wall of the tungsten layer 5.

Thereafter, as not shown in FIG. 2, the polysilicon layer 3 and the gate oxide layer 2 are etched to form a gate electrode. Next, LDD ion implantation and gate re-oxidation processes are performed, respectively.

As described above, when performing gate re-oxidation process, abnormal oxidation is not occurred on side of the tungsten layer 5 by the spacer 8. However, since the width of the gate electrode increases due to the spacer 6, it is difficult to apply high integration semiconductor device required for a gate electrode with fine line width.

SUMMARY OF THE INVENTION

It is therefore an object of the present invention to provide a method of forming a gate electrode in a semiconductor device which can prevent abnormal oxidation of a tungsten layer without increasing the line width of the gate electrode by etching a tungsten layer and a diffusion barrier layer to the width of a spacer prior to forming the spacer, for solving the problems in the conventional art.

To accomplish this above object, a method of forming a gate electrode in a semiconductor device according to the present invention includes steps of: forming a gate oxide layer, a polysilicon layer, a diffusion barrier layer, a metal layer and a mask layer on a semiconductor substrate, in sequence; patterning the mask layer, the metal layer and the diffusion barrier layer to the first width; patterning the mask layer, the metal layer and the diffusion barrier layer having the first width to a second width by wet etching; forming a spacer on the side walls of the mask layer, the metal layer and the diffusion barrier layer having the second width; and patterning the polysilicon layer and the gate oxide layer using the mask layer and the spacer as an etch barrier.

According to the present invention, since a spacer is formed on the sides a metal layer and a diffusion barrier layer after etching the metal layer and the diffusion barrier layer to the width of the spacer, it is possible to obtain a gate electrode with fine line width and abnormal oxidation is not occurred on the sides of the metal layer.

DETAILED DESCRIPTION OF THE INVENTION

Hereinafter, a preferred embodiment of the present invention will be explained with reference to accompanying drawings.

FIG. 3A to FIG. 3F are cross sectional views describing a method of forming a gate electrode in a semiconductor device according to an embodiment of the present invention.

Figure 1:
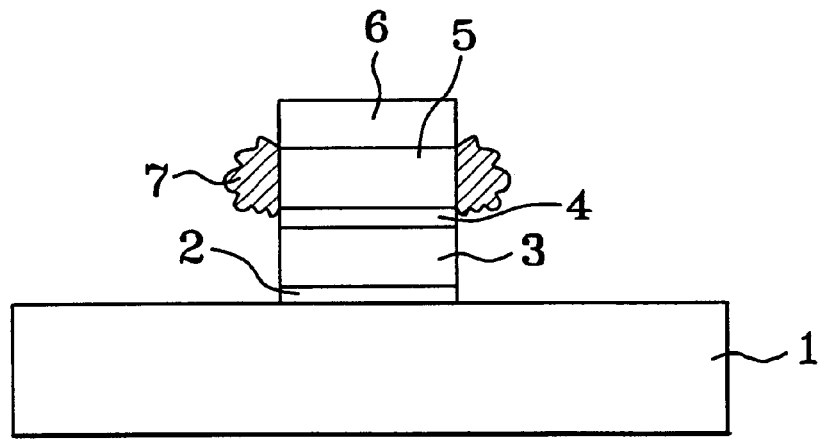
FIG. 1 is a cross sectional view describing problem in a tungsten gate electrode according to a prior art.
Figure 2:
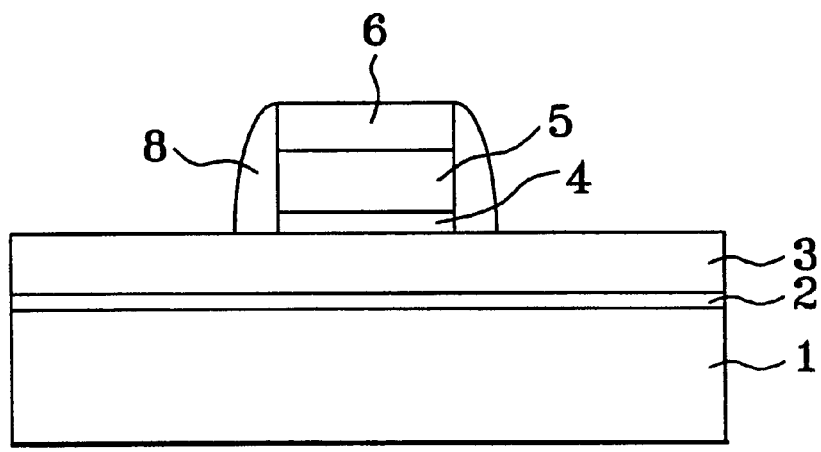
FIG. 2 is a cross sectional view describing problem in tungsten gate electrode according to another prior art.
Figure 3A:
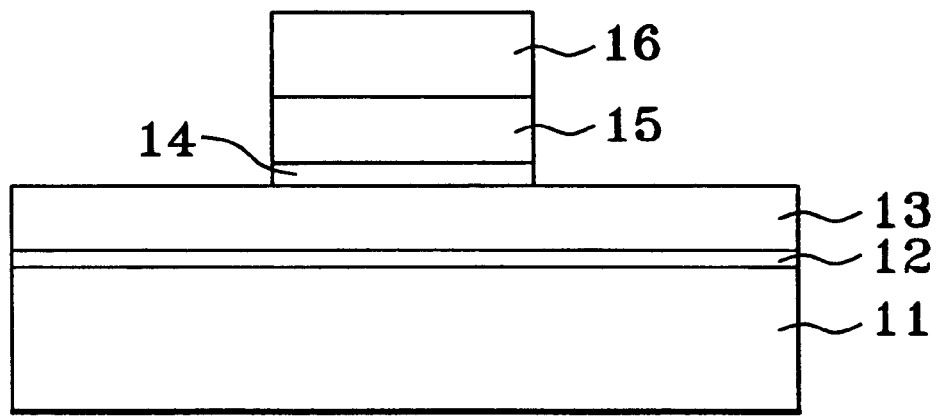
FIG. 3A to FIG. 3D are cross sectional views describing a method of forming a gate electrode in a semiconductor device according to an embodiment of the present invention.

As shown in FIG. 3A, a gate oxide layer 12 is formed on a semiconductor substrate 11 to the thickness of 100 Å or less, preferably 50 to 100 Å and a doped polysilicon layer 13 is formed thereon to the thickness of 500 to 1,000 Å. A diffusion barrier layer 14 is then formed on the polysilicon layer 13 to the thickness of 10 to 500 Å. Here, the diffusion barrier layer 14 is formed of a nitride layer such as a titanium nitride(TiN) layer or a tungsten nitride(WN) layer. Thereafter, a metal layer, preferably, a tungsten layer 15 is deposited on the diffusion barrier layer 14 by sputtering or chemical vapor deposition(CVD). Preferably, the tungsten layer 15 is formed to the thickness of 100 to 2,000 Å. A mask layer 16 used for etch barrier is then formed to the thickness of 1,000 to 2,000 Å. Preferably, the mask layer 16 is formed of one selected from group consisting of an oxide layer, a nitride layer and a stacked layer of the oxide layer and the nitride layer. Next, the mask layer 16, the tungsten layer 15 and the diffusion barrier layer 14 are etched to the substantial width of a gate electrode.

Figure 3B:
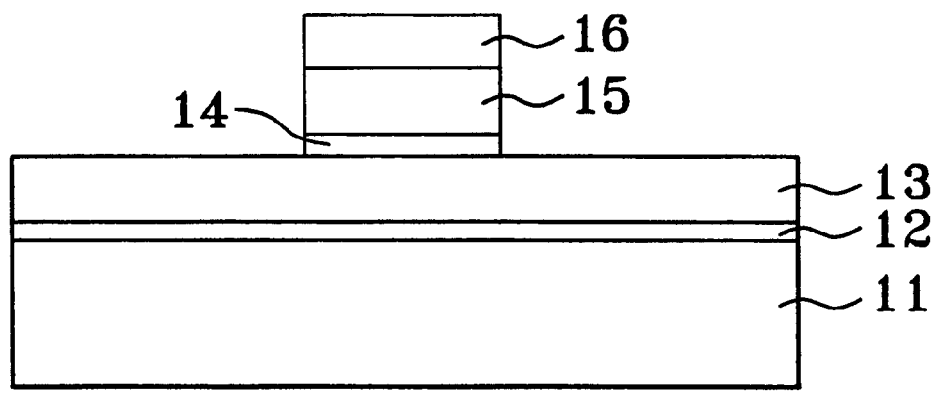

As shown in FIG. 3B, the sides of the mask layer 16, the tungsten layer 15 and the diffusion barrier layer 14 are etched by wet etching. Preferably, the wet etching is performed using etchant wherein etching selectivity of the mask layer 16, the tungsten layer 15 and the diffusion barrier layer 14 are equalized to each other, and particularly, etching selectivity of the mask layer 16, the tungsten layer 15 and the diffusion barrier layer 14 to the polysilicon layer is over 20:1. Furthermore, the wet etching is performed so that the sides of the mask layer 16, the tungsten layer 15 and the diffusion barrier layer 14 are etched as the width of a spacer which will be formed after, preferably, 50 to 500 Å.

Figure 3C:
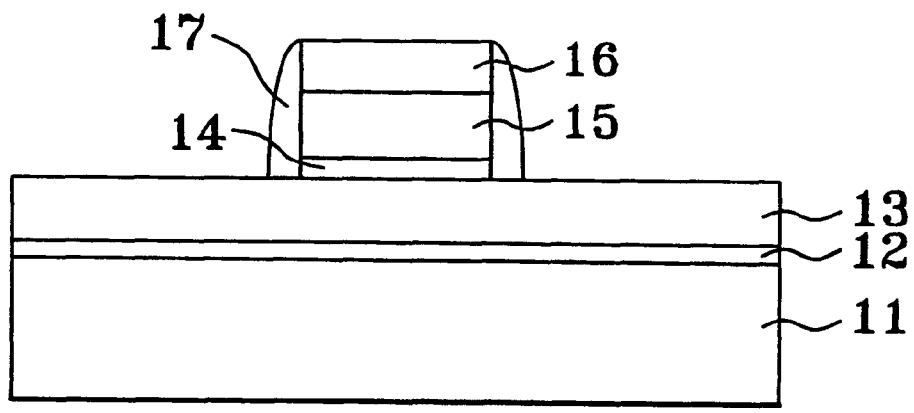

As shown in FIG. 3C, the spacer 17 is formed on the side walls of the mask layer 16, the tungsten layer 15 and the diffusion barrier layer 14 etched by wet etching. The spacer 17 is formed of one selected from group consisting of an oxide layer, a nitride layer and a stacked layer of the oxide layer and the nitride layer. Preferably, the spacer 17 is formed to the thickness of 50 to 500 Å.

Figure 3D:
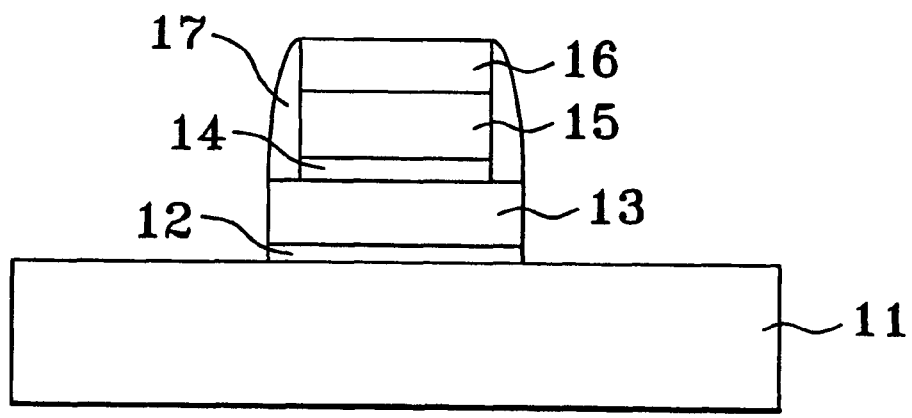

As shown in FIG. 3D, the polysilicon layer 13 and the gate oxide layer 12 are etched using the mask layer 16 and the spacer 17 as an etch barrier to form a tungsten gate electrode.

Thereafter, as not shown in the drawings, for removing damage of the substrate due to the etching process and polysilicon residues and improving the reliability of the gate oxide layer, gate re-oxidation process is performed. At this time, the sides of the tungsten layer is not exposed by the spacer, thereby preventing abnormal oxidation of the tungsten layer.

Therefore, gate re-oxidation process is stably performed, so that it is prevented to deteriorate the properties of a semiconductor device.

According to the present invention, since a spacer is formed on the sides of a mask layer, a tungsten layer and a diffusion barrier layer after etching the mask layer, the metal layer and the diffusion barrier layer to the width of the spacer, it is possible to obtain a gate electrode with fine line width.

Furthermore, when performing gate re-oxidation process, abnormal oxidation is not occurred on the side of the tungsten layer by the spacer.

Accordingly, the properties and reliability of a semiconductor device are improved and it is easy to apply the above gate electrode to high integration device.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode in a semiconductor device, comprising the steps of:

forming a gate oxide layer, a polysilicon layer, a diffusion barrier layer, a metal layer and a mask layer on a semiconductor substrate, in sequence;

patterning the mask layer, the metal layer and the diffusion barrier layer to the first width;

patterning the mask layer, the metal layer and the diffusion barrier layer having the first width to a second width by wet etching;

forming a spacer on the side walls of the mask layer, the metal layer and the diffusion barrier layer having the second width; and patterning the polysilicon layer and the gate oxide layer using the mask layer and the spacer as an etch barrier.

2. The method according to claim 1, wherein the gate oxide layer is formed to the thickness of 50 to 100 Å.

3. The method according to claim 1, wherein the polysilicon layer is formed to the thickness of 500 to 1,000 Å.

4. The method according to claim 1, wherein the diffusion barrier layer is formed of a nitride layer such as a titanium nitride(TiN) layer or a tungsten nitride(WN) layer.

5. The method according to claim 1, wherein the diffusion barrier layer is formed to the thickness of 10 to 500 Å.

6. The method according to claim 4, wherein the diffusion barrier layer is formed to the thickness of 10 to 500 Å.

7. The method according to claim 1, wherein the metal layer is formed of a tungsten layer.

8. The method according to claim 7, wherein the tungsten layer is formed to the thickness of 100 to 2,000 Å.

9. The method according to claim 1, wherein the mask layer is formed of one selected from the group consisting of an oxide layer, a nitride layer and a stacked layer of the oxide layer and the nitride layer.

10. The method according to claim 1, wherein the mask layer is formed to the thickness of 1,000 to 2,000 Å.

11. The method according to claim 9, wherein the mask layer is formed to the thickness of 1,000 to 2,000 Å.

12. The method according to claim 1, wherein the wet etching is performed using etchant wherein etching selectivity of the mask layer, the tungsten layer and the diffusion barrier layer are equalized to each other, and etching selectivity of the mask layer, the tungsten layer and the diffusion barrier layer to the polysilicon layer is over 20:1.

13. The method according to claim 1, wherein the wet etching is performed so that the first width of the mask layer, the metal layer and the diffusion barrier layer are etched as 50 to 500 Å.

14. The method according to claim 1, wherein the spacer is formed of one selected from the group consisting of an oxide layer, a nitride layer and a stacked layer of the oxide layer and the nitride layer.

15. The method according to claim 1, wherein the width of the spacer is 50 to 500 Å.

16. The method according to claim 14, wherein the width of the spacer is 50 to 500 Å.

* * * * *